US012757590B2

(12) United States Patent
Jeong et al.

(10) Patent No.: US 12,757,590 B2

(45) Date of Patent: Oct. 6, 2026

(54) LIGHT EMITTING DISPLAY DEVICE

(71) Applicant: LG Display Co., Ltd., Seoul (KR)

(72) Inventors: Yoon Seob Jeong, Paju-si (KR); Yong Min Park, Paju-si (KR)

(73) Assignee: LG DISPLAY CO., LTD., Seoul (KR)

(*) Notice: Subject to any disclaimer, the term of this patent is extended or adjusted under 35 U.S.C. 154(b) by 706 days.

(21) Appl. No.: 17/976,555

(22) Filed: Oct. 28, 2022

(65) Prior Publication Data

US 2023/0217743 A1 Jul. 6, 2023

(30) Foreign Application Priority Data

Dec. 31, 2021 (KR) ........................ 10-2021-0194774

(51) Int. Cl.

*H10K 59/131* (2023.01)
*H10K 59/80* (2023.01)
*H10K 59/88* (2023.01)
*H10K 71/00* (2023.01)

(52) U.S. Cl.

CPC ........... *H10K 59/131* (2023.02); *H10K 59/80* (2023.02); *H10K 59/88* (2023.02); *H10K 71/861* (2023.02)

(58) Field of Classification Search

CPC ...... H10K 59/131; H10K 50/80; H10K 59/88; H10K 71/861; H10K 59/80; H10K 59/126; H10K 59/351; H10K 50/81; H10K 59/122; H10K 59/123; H10K 59/35

See application file for complete search history.

(56) References Cited

U.S. PATENT DOCUMENTS

2020/0004381 A1* 1/2020 Han ........................ H10K 59/40
2020/0212131 A1* 7/2020 Kim ........................ H10K 59/88

FOREIGN PATENT DOCUMENTS

JP 2011071032 A * 4/2011
KR 10-2010-0093220 A 8/2010
KR 10-2020-0058069 A 5/2020

* cited by examiner

*Primary Examiner* — Steven B Gauthier
*Assistant Examiner* — Alvin L Lee
(74) *Attorney, Agent, or Firm* — Birch, Stewart, Kolasch & Birch, LLP

(57) ABSTRACT

A light emitting display device can include a substrate including a plurality of sub-pixels each including an emission part and a non-emission part, a light emitting element including an anode, an organic layer, and a cathode at each of the sub-pixel, and a repair lens including a light-shielding metal layer under the anode.

19 Claims, 12 Drawing Sheets

LIGHT EMITTING DISPLAY DEVICE

CROSS-REFERENCE TO RELATED APPLICATIONS

This application claims priority to Korean Patent Application No. 10-2021-0194774, filed in the Republic of Korea on Dec. 31, 2021, the entire contents of which are hereby expressly incorporated by reference into the present application.

BACKGROUND

Field of the Invention

The present disclosure relates to a display device, and particularly, to a light emitting display device for preventing a metal layer from being damaged and achieving a normal repair in a structure in which repair is performed by separating an anode of an emission part from an anode connection pattern, by radiating a laser.

Discussion of the Related Art

With the advent of the information age, displays for visually representing electrical information signals have developed rapidly, and various thin and lightweight display devices having low power consumption and high performance have been developed and are rapidly replacing the existing cathode ray tubes (CRTs).

Among such display devices, a light emitting display device that does not require a separate light source, does not have a separate light source for a compact device and clear color display, and includes light emitting elements in a display panel is considered as a competitive application.

Meanwhile, light emitting display devices are subjected to inspection before being released, and when a defective sub-pixel having a bright or dark spot is detected in the inspection step, repair is performed to separate a light emitting part of the defective sub-pixel from a driving circuit.

SUMMARY OF THE DISCLOSURE

An object of the present disclosure is to provide a light emitting display device additionally including a component for controlling light such that radiated laser light can be focused on an anode when the anode is repaired. Further, the component for controlling light is connected to a component to which a power supply voltage is applied, to achieve voltage stability even when repair is not performed.

The light emitting display device of the present disclosure can include a repair lens under a narrow area of an anode where repair is performed such that light transmitted from the bottom of a substrate is focused on the anode during repair to prevent a cathode from being damaged.

A light emitting display device according to an embodiment of the present disclosure can include a substrate including a plurality of sub-pixels each including an emission part and a non-emission part, a light emitting element including an anode, an organic layer, and a cathode at each of the sub-pixels, and a repair lens. The repair lens includes a light-shielding metal layer under the anode. In the present disclosure, there are no other metal layers between the anode and the repair lens in a vertical direction.

BRIEF DESCRIPTION OF THE DRAWINGS

The present disclosure will become more fully understood from the detailed description given hereinbelow and the accompanying drawings which are given by way of illustration only, and thus are not limitative of the present disclosure.

DETAILED DESCRIPTION OF THE EMBODIMENTS

Figure 1:
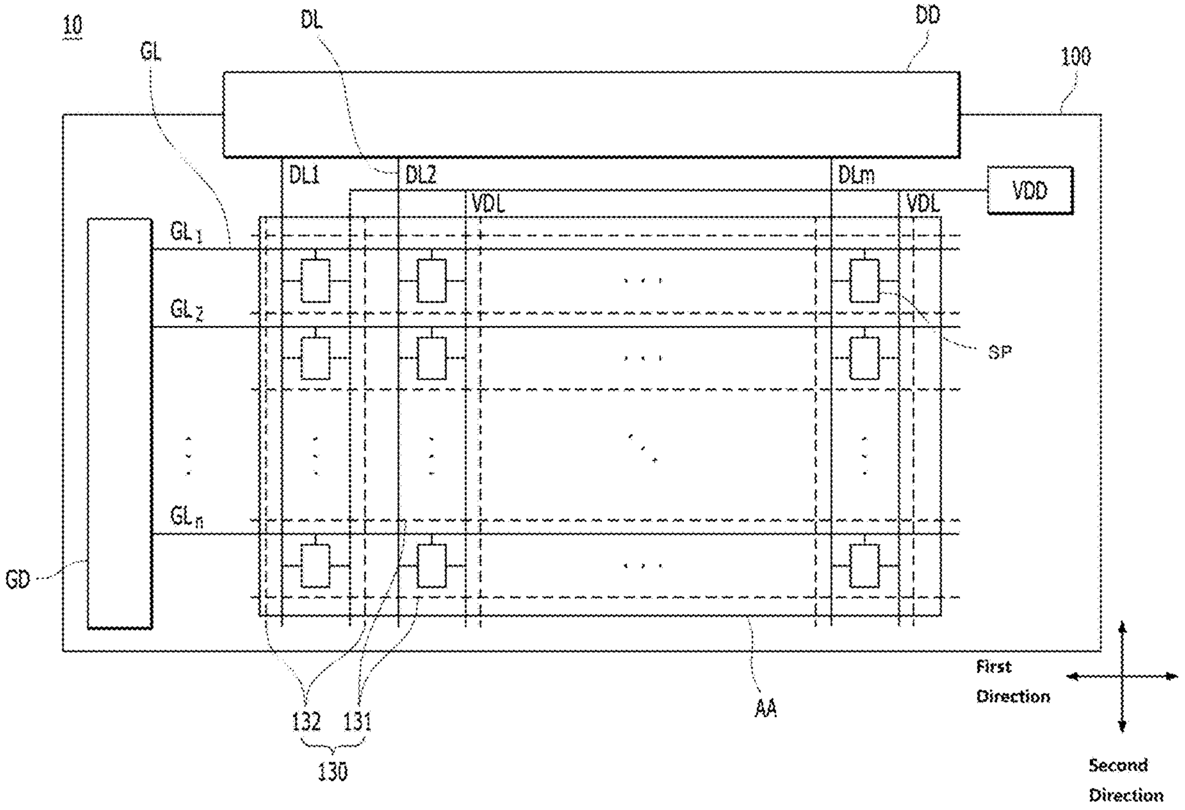
FIG. 1 is a block diagram schematically showing a light emitting display device according to an embodiment of the present disclosure.

Hereinafter, preferred embodiments of the present disclosure will be described with reference to the attached drawings. The same reference numbers will be used throughout this specification to refer to the same or like parts. In the following description of the present disclosure, a detailed description of known functions and configurations incorporated herein may be omitted or may be provided briefly when it can obscure the subject matter of the present disclosure.

In the drawings for explaining the exemplary embodiments of the present disclosure, for example, the illustrated shape, size, ratio, angle, and number are given by way of example, and thus, are not limited to the disclosure of the present disclosure. Throughout the present specification, the same reference numerals designate the same constituent elements. In addition, in the following description of the present disclosure, a detailed description of known functions and configurations incorporated herein may be omitted or may be provided briefly when it can make the subject matter of the present disclosure rather unclear. The terms "comprises", "includes" and/or "has", used in this specification, do not preclude the presence or addition of other elements unless it is used along with the term "only". The singular forms are intended to include the plural forms as well, unless the context clearly indicates otherwise.

In interpreting a component, it is interpreted as including an error range even if there is no separate explicit description.

When describing positional relationships, for example, when the positional relationship between two parts is described using "on", "above", "below", "aside", or the like, one or more other parts can be located between the two parts unless the term "directly" or "closely" is used.

In the description of the various embodiments of the present disclosure, when describing temporal relationships, for example, when the temporal relationship between two actions is described using "after", "subsequently", "next", "before", or the like, the actions may not occur in succession unless the term "directly" or "just" is used.

In the following description of the embodiments, "first" and "second" are used to describe various components, but such components are not limited by these terms. The terms are used to discriminate one component from another component. Accordingly, a first component mentioned in the following description can be a second component within the technical spirit of the present disclosure.

The respective features of the various embodiments of the present disclosure can be partially or wholly coupled to and combined with each other, and various technical linkage and driving thereof are possible. These various embodiments can be performed independently of each other, or can be performed in association with each other.

Although an organic light emitting display device will be mainly described below as a light emitting display device according to an embodiment of the present specification, the material of light emitting elements used in the display device is not limited to organic materials. In some cases, a light emitting material can be an organic material, an inorganic material such as quantum dots or nitride semiconductor, or a synthetic material of an organic material and an inorganic material such as perovskite. Further, all components of each light emitting display device according to all embodiments of the present disclosure are operatively coupled and configured.

Figure 2:
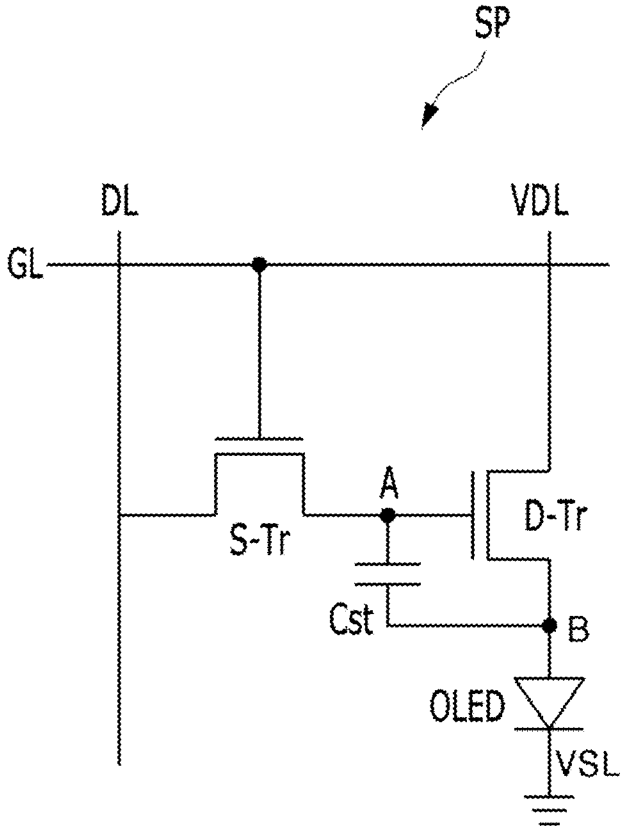
FIG. 2 is a circuit diagram of each sub-pixel of FIG. 1.

FIG. 1 is a block diagram schematically showing a light emitting display device according to the present disclosure, and FIG. 2 is a circuit diagram of each sub-pixel of FIG. 1.

As shown in FIG. 1, a light emitting display device 10 of the present disclosure can have a polygonal shape, a circular shape, or a shape including both corner portions and straight portions. As an example, FIG. 1 shows an example in which the light emitting display device includes a rectangular substrate 100, but the present disclosure is not limited thereto.

In addition, the substrate 100 can be divided into a display area AA positioned at the center and an outer area around the display area AA. In the display area AA, sub-pixels SP each including an emission part (EM in FIG. 3) and a non-emission part NEM around the emission part are arranged in a matrix.

The sub-pixels SP are defined by gate lines GL and data lines DL that intersect each other. In addition, the display area AA further includes driving voltage lines VDL to which a driving voltage for driving a sub-pixel circuit included in each sub-pixel SP is applied. The driving voltage lines VDL are provided in the same direction as the data lines DL and connected to a driving thin film transistor D-Tr which is a part of the sub-pixel circuit.

The sub-pixel circuit connected to the aforementioned lines will be described with reference to FIG. 2. The sub-pixel circuit includes a switching thin film transistor S-Tr provided at the intersection of a gate line GL and a data line DL, a driving thin film transistor D-Tr provided between the switching thin film transistor S-Tr and a driving voltage line VDL, a light emitting element OLED connected to the driving thin film transistor D-Tr, and a storage capacitor Cst provided between a gate electrode and a drain electrode (or a source electrode) of the driving thin film transistor D-Tr.

Here, the switching thin film transistor S-Tr is formed in a region where the gate line GL and the data line DL intersect and serves to select the corresponding sub-pixel, and the driving thin film transistor D-Tr serves to drive the light emitting element OLED of the sub-pixel selected by the switching thin film transistor S-Tr.

The outer area (outside the display area) includes a gate driver GD for supplying a scan signal to the gate lines GL and a data driver DD for supplying a data signal to the data lines DL. In addition, the driving voltage lines VDL can be connected to a power supply voltage supply unit VDD provided in the outer area to be provided with a driving voltage or can be provided with the driving voltage through the data driver DD.

Here, the gate driver GD and the data driver DD/power supply voltage supply unit VDD can be directly formed in the outer area of the substrate 100 when thin film transistors are formed in the display area AA or can be attached to the outer area of the substrate 100 in the form of a separate film or printed circuit board. The circuit drivers of the gate driver GD, the data driver DD, and the power supply voltage supply unit VDD are provided in the outer area around the display area AA. For this, the display area AA is defined inside the edge of the substrate 100.

The gate driver GD sequentially supplies scan signals to the plurality of gate lines GL. For example, as a control circuit, the gate driver GD supplies scan signals to the plurality of gate lines GL1 to GLn in response to a control signal supplied from a timing controller or the like.

In addition, the data driver DD supplies a data signal to selected data lines DL1 to DLm among the data lines DL in response to a control signal supplied from the outside, for example, from the timing controller. The data signal supplied to the data lines DL1 to DLm is supplied to a sub-pixel SP selected by a scan signal whenever a scan signal is supplied to the gate lines GL1 to GLn. Here. n and m are positive numbers such as integers greater than 1. Accordingly, the sub-pixel SP is charged with a voltage corresponding to the data signal and emits light with a luminance corresponding thereto.

The substrate 100 can be an insulating substrate made of plastic, glass, ceramic, or the like, and when the substrate 100 is made of plastic, it can be slim and flexible. However, the material of the substrate 100 is not limited thereto, and can include a metal and further include an insulating buffer layer on a side where wiring is formed.

In addition, a pixel can be defined by a set of a plurality of sub-pixels SP, for example, three or four sub-pixels emitting light of different colors.

The sub-pixel SP refers to a unit having a specific type of color filter or capable of emitting light of a specific color through a light emitting element OLED without a color filter. Colors defined by the sub-pixels SP include red (R), green (G), and blue (B), and in some cases, can optionally include white (W), but the present disclosure is limited thereto.

The switching thin film transistor S-Tr is connected to the driving thin film transistor D-Tr at a first node A. The light emitting element OLED is connected to the driving thin film transistor D-Tr at a second node B and includes an anode (151 in FIGS. 3 and 7) provided in each sub-pixel SP, a cathode 153 facing the anode, and an organic layer 152 interposed between the anode 151 and the cathode 153.

Meanwhile, the light emitting display device 10 can be of a top emission type, a bottom emission type, or a dual emission type. Here, in a large-area display panel, a voltage drop can occur in cathodes of light emitting diodes with high resistance in the process of forming the cathodes on the entire surface of the display area irrespective of the emission type. Accordingly, to solve this, a power supply voltage line VSL, an auxiliary electrode or an auxiliary line 130 for supplying a base voltage VSS to the cathode (refer to 153 in FIG. 7) is provided in the non-emission part (refer to NEM in FIG. 3) in the display area AA.

The auxiliary line 130 and the driving voltage line VDL can also be referred to as a first power supply voltage line and a second power supply voltage line because a power supply voltage is applied thereto. The auxiliary line 130 receives a base voltage VSS, and the driving voltage line VDL receives a driving voltage VDD.

Here, the auxiliary line 130 is made of the same material as the data line DL and includes a contact through which the auxiliary line 130 having high conductivity is connected to the cathode in each sub-pixel or pixel. Accordingly, the resistance of the cathode is lowered in the direction in which the auxiliary line 130 extends, and thus a voltage drop in the cathode which gradually become severe from the edge to the center can be prevented.

In the example shown in FIG. 1, the auxiliary line 130 includes a first line 131 in the direction of the gate line GL and a second line 132 in the direction of the data line DL, but the present disclosure is not limited thereto and the first and second lines can be arranged in one of the directions. The auxiliary line 130 is also referred to as a power supply voltage line because the base voltage VSS is supplied thereto.

As described above, the auxiliary line 130 can be patterned along with the data line DL, for example, one electrode of a thin film transistor, or can be formed when a light blocking metal layer under the thin film transistor is formed. The auxiliary line 130 can be a single layer made of Cu, Mo, Al, Ag, or Ti or multiple layers made of a combination of the materials, and is connected to the cathode at the second node B to lower the resistance of the cathode.

The light emitting display device of the present disclosure is advantageous when the cathode is configured as a transparent electrode having high resistance, or when it is applied to a top emission type display device or a transparent display device having reflective transmittance. However, the present disclosure is not limited thereto and can be applied to any light emitting display device for preventing a voltage drop in the cathode.

The sub-pixel circuit shown in FIG. 2 is merely an example, and the present disclosure is not limited to the illustrated example. If necessary, thin film transistors can be added or removed or a capacitor can be further provided to enhance compensation or deterioration prevention function.

Figure 3:
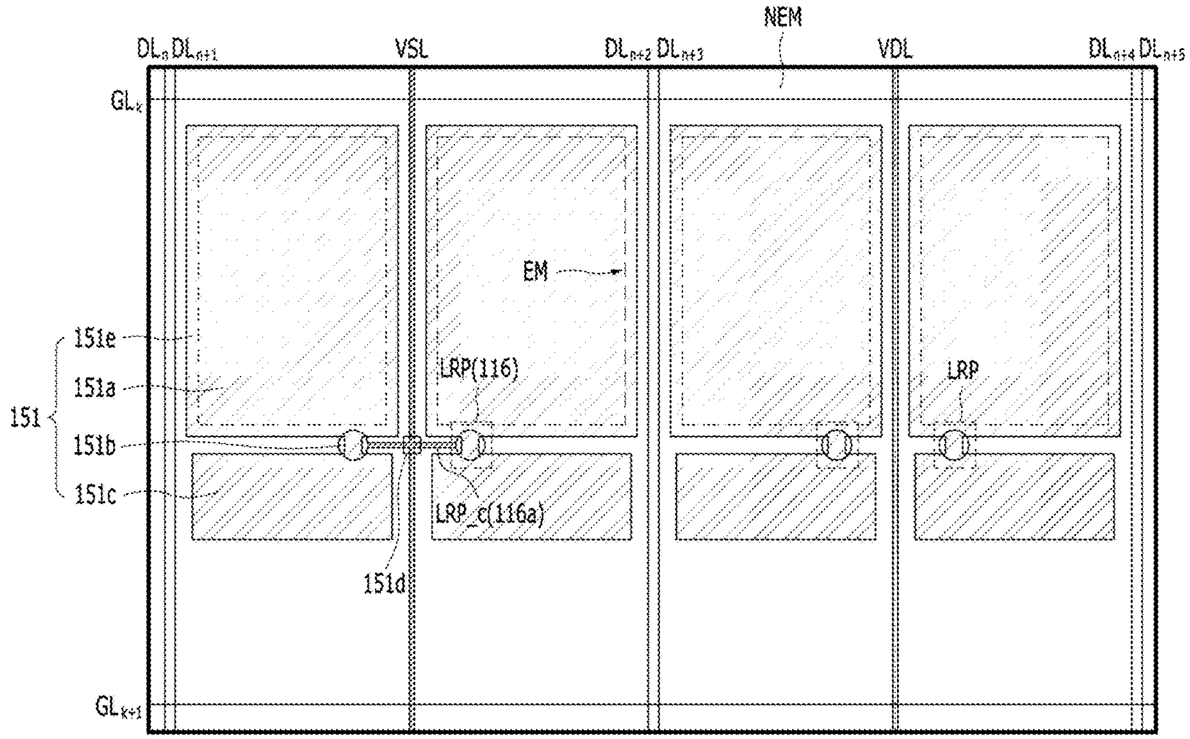
FIG. 3 is a plan view showing a light emitting display device according to an embodiment of the present disclosure.
Figure 4:
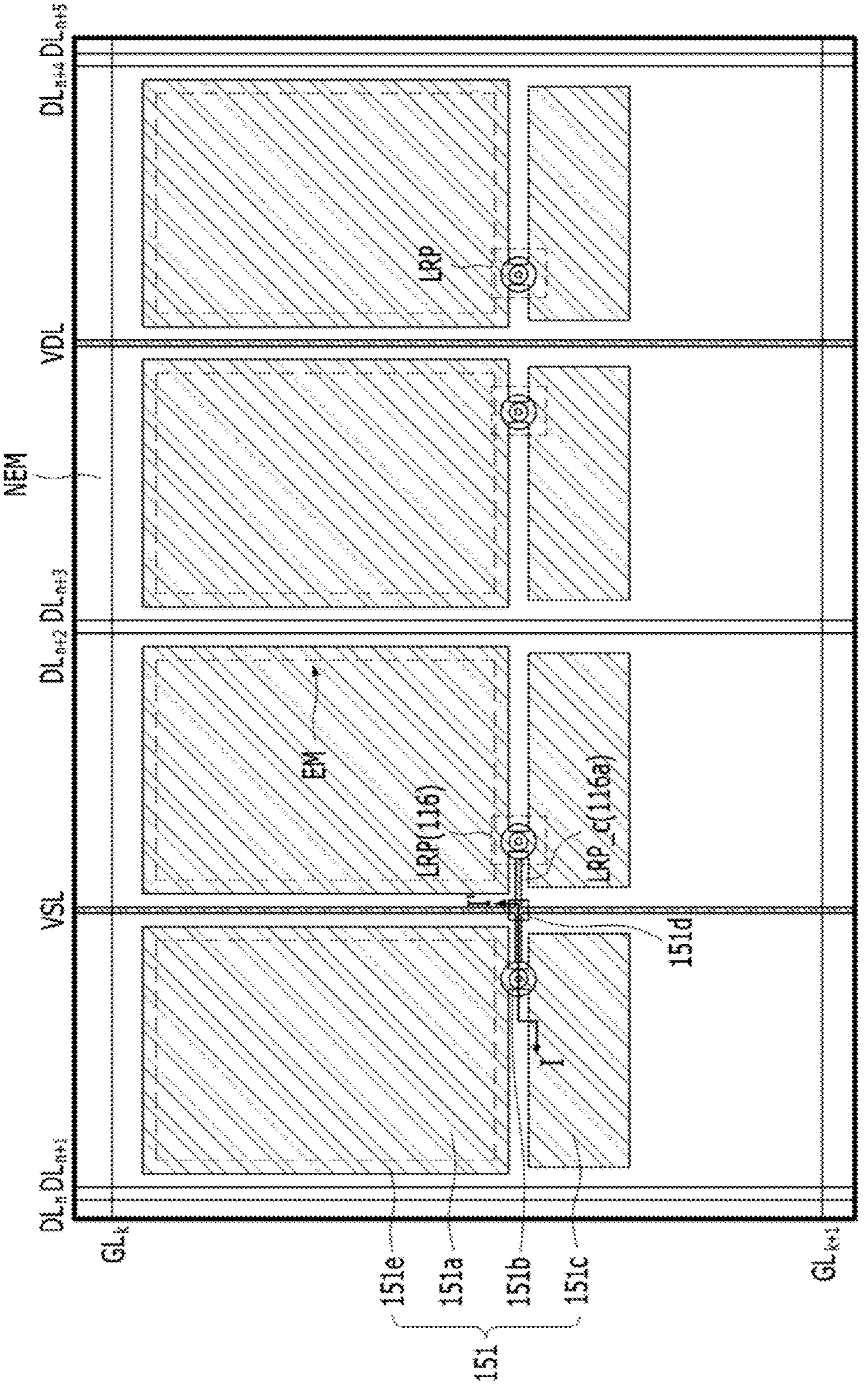
FIG. 4 is a plan view showing an example in which a plurality of closed loop patterns is provided in a repair lens of FIG. 3.
Figure 5:
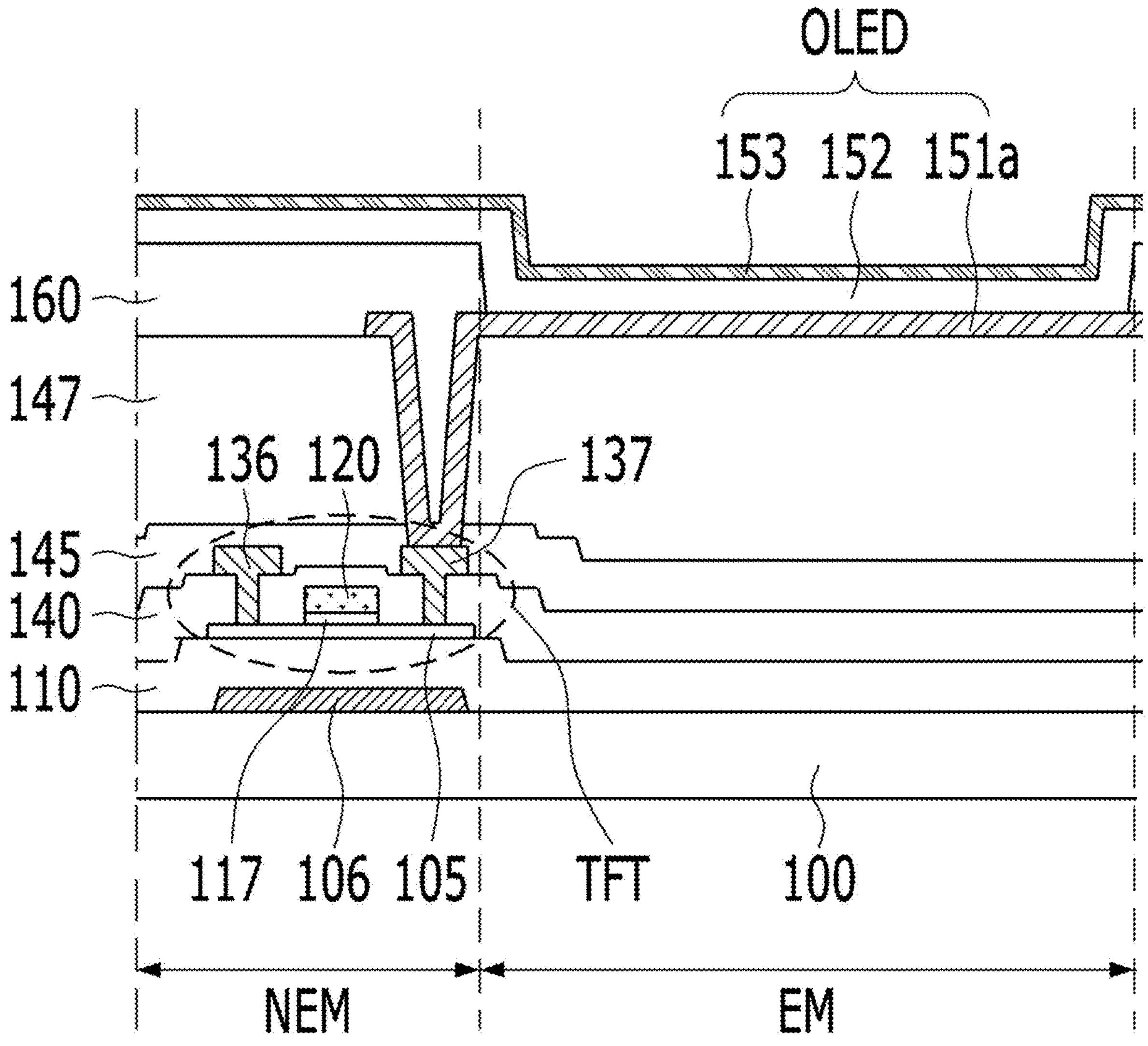
FIG. 5 is a cross-sectional view showing connection between a thin film transistor and a light emitting element of the light emitting display device according to an embodiment of the present disclosure.
Figure 6:
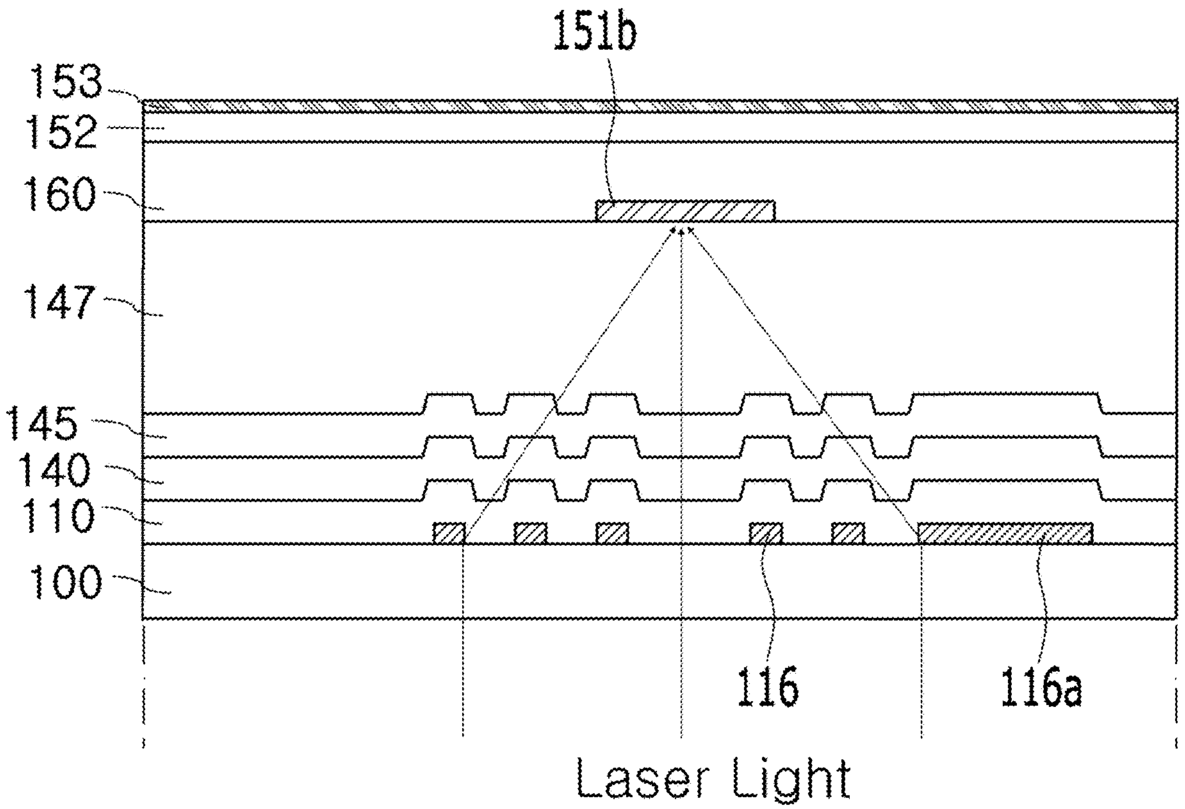
FIG. 6 is a cross-sectional view showing transmission of light when laser light is radiated to the repair lens adjacent to a first voltage line of FIG. 4 during repair.

FIG. 3 is a plan view showing a light emitting display device according to an embodiment of the present disclosure, and FIG. 4 is a plan view showing an example in which a plurality of closed loop patterns is provided in a repair lens shown in FIG. 3. FIG. 5 is a cross-sectional view showing connection between a thin film transistor and a light emitting element of the light emitting display device of the present disclosure, and FIG. 6 is a cross-sectional view showing transmission of light when laser light is radiated to the repair lens adjacent to a first power supply voltage line shown in FIG. 4 during repair.

As shown in FIGS. 3 to 6, the light emitting display device of the present disclosure includes a substrate 100 including a plurality of sub-pixels SP each including an emission part EM and a non-emission part NEM, and a light emitting element OLED provided in each sub-pixel SP and including an anode 151, an organic layer 152, and a cathode 153.

The emission part EM and the non-emission part NEM can be divided by forming a bank 160. For example, an open area of the bank 160 can serve as the emission part EM, and an area in which the bank 160 is provided can serve as the non-emission part NEM. In some cases, when the light emitting display device functions as a transparent display device including a transmissive part, a part of the non-emission part NEM in which the anode 151 is not positioned in FIGS. 3 and 4 can be used as the transmissive part.

FIGS. 3 and 4 show anodes 151 for four sub-pixels, gate lines $GL_k$ and $GL_{k+1}$, data lines $DL_n$, $DL_{n+1}$, $DL_{n+2}$, $DL_{n+3}$, $DL_{n+4}$, and $DL_{n+5}$, a first power supply voltage line VSL, and a second power supply voltage line VDL which define the anode 151 of each sub-pixel.

Although each of the gate lines $GL_k$ and $GL_{k+1}$, data lines $DL_n$, $DL_{n+1}$, $DL_{n+2}$, $DL_{n+3}$, $DL_{n+4}$, and $DL_{n+5}$, first power supply voltage line VSL, and second power supply voltage line VDL can be connected to neighboring sub-pixels by including a protruding pattern, FIGS. 3 and 4 focus on the relationship between the shape of the anode 151 and the repair lens LRP and thus other components are omitted.

The anode 151 includes an anode emission part 151*a* corresponding to the emission part EM, an anode driving part 151*c* overlapping with the sub-pixel circuit, and an anode connection part 151*b* for connecting the anode emission part 151*a* and the anode driver 151*c*. As shown in FIGS. 3 and 4, the part around the anode emission part 151*a* covered by the bank 160 is an anode extension part 151*e* integrated with the anode emission part 151*a*. In some cases, the anode extension part 151*e* can overlap with the data lines $DL_n$, $DL_{n+1}$, $DL_{n+2}$, $DL_{n+3}$, $DL_{n+4}$, and $DL_{n+5}$, the first power supply voltage line VSL, and the second power supply voltage line VDL or other lines and can serve as a part of a thin film transistor or a part of a storage capacitor. In some cases, the anode connection part 151*b* can be directly connected to the anode emission part 151*a* without having the anode extension part 151*e* disposed therebetween.

As shown in FIG. 3, the repair lens LRP is positioned to correspond to the narrowest anode connection part 151*b* in the anode 151. This is because the anode connection part 151*b* is separated during repair and laser light is focused on the anode connection part 151*b*, which is a local area, using the repair lens LRP to facilitate cutting and separation through energy concentration by the laser light.

As shown in FIGS. 4 and 6, the repair lens LRP can include a plurality of concentric closed loop patterns 116. The plurality of closed loop patterns 116 are spaced apart from each other, and light is transmitted through the spaced portions.

No other metal layers are interposed between the repair lens LRP and the anode connection part 151*b*, and the repair lens LRP functions to focus light on the anode connection part 151*b* according to the Fresnel lens effect.

The diameter of the outmost closed loop pattern 116 of the repair lens LRP is greater than the anode connection part 151*b*, and this closed loop pattern 116 close to the outer diameter of the repair lens LRP focuses light from the bottom of the substrate 100 but does not prevent direct light from being transmitted to the anode connection part 151*b*.

The plurality of closed loop patterns 116 has a narrow width, and the inside of the innermost closed loop pattern 116 does not include a metal layer extending from the lower surface of the substrate 100 to the anode connection part 151*b* and directly transmits light from the bottom of the substrate 100 to the anode connection part 151*b*.

The closed loop patterns 116 constituting the repair lens LRP are made of a light-shielding metal and can be formed from a lowermost metal layer on the substrate 100.

The light-shielding metal is also called an LS line and, as shown in FIG. 5, can be provided under a thin film transistor TFT to prevent light from being transmitted from the bottom of the substrate 100 to a semiconductor layer 105 of the thin film transistor TFT or to prevent impurities under the substrate 100 from having an electrical influence on the semiconductor layer 105.

As shown in FIGS. 3 and 4, the first and second power supply voltage lines VSL and VDL are wider than the data lines $DL_n$, $DL_{n+1}$, $DL_{n+2}$, $DL_{n+3}$, $DL_{n+4}$, and $DL_{n+5}$ and serve to constantly supply the base power supply voltage and the driving power supply voltage transmitted in one direction over the display area AA of the substrate 100 without decreasing the voltages. The first and second power supply voltage lines VSL and VDL can serve to supply the base power supply voltage and the driving power supply voltage to a plurality of adjacent sub-pixels arranged and extending in the horizontal direction.

In addition, the data lines $DL_n$, $DL_{n+1}$, $DL_{n+2}$, $DL_{n+3}$, $DL_{n+4}$, and $DL_{n+5}$ transmit data signals to left and right adjacent sub-pixels.

In the repair lens LRP of the present disclosure, the closed loop patterns 116 are made of a light-shielding metal layer, and even when laser light is radiated thereto, the closed loop patterns are not damaged by the laser light because the width of the closed loop patterns 116 is as thin as 2 μm and the closed loop patterns 116 have an interval of 0.5 μm to 3 μm and thus the laser light is diffracted between the closed loop patterns 116 when the laser light passes through the closed loop patterns 116. Here, the light-shielding metal layer constituting the closed loop patterns 116 can be a single layer formed of Cu, Mo, Al, Ag, or Ti, or a plurality of layers formed of a combination thereof.

As shown in FIGS. 3 and 4, the outermost closed loop pattern 116 extends to the first power supply voltage line VSL such that a base voltage signal can be directly applied thereto.

Referring to FIG. 1, when the auxiliary line 130 is formed as the first power supply voltage line VSL, the outermost closed loop pattern 116 can be directly connected to the data driver (DD in FIG. 1) above the auxiliary line 130 to receive the base voltage signal.

The thin film transistor connected to the anode 151 of the light emitting element OLED will be described with reference to FIG. 5.

A light-shielding metal layer 106 is the first metal layer formed on the substrate 100, and in some cases, a barrier insulating film can be further provided between the light-shielding metal layer 106 and the substrate 100 to primarily block impurities from the substrate 100.

As shown in FIG. 6, the repair lens LRP including the closed loop patterns 116 made of the same metal as the light-shielding metal layer 106 is formed on the same layer as the light-shielding metal layer 106.

A buffer layer 110 can be further provided on the light-shielding metal layer 106 to provide protection.

The thin film transistor TFT includes a semiconductor layer 105 and a gate electrode 120 having a gate insulating film 117 interposed between the semiconductor layer 105 and the gate electrode 120, and a source electrode 136 and a drain electrode 137 connected to both sides of the semiconductor layer 105.

The semiconductor layer 105 can be formed of any one of crystalline silicon, amorphous silicon, and an oxide semiconductor, or can be formed by laminating layers of crystalline silicon, amorphous silicon, and an oxide semiconductor. In some cases, an ohmic contact layer can be further applied thereon, or a metal can be further included therein excluding the channel. However, the semiconductor layer 105 is not limited to the described example and can include other semiconductor materials.

Although the gate electrode 120 is disposed on the upper side of the semiconductor layer 105 in the illustrated example, the present disclosure is not limited thereto and the gate electrode 120 can be provided under the semiconductor layer 105.

Further, although an example in which the gate insulating layer 117 is formed only in the channel region of the semiconductor layer 105 is illustrated, this is an example in which the gate electrode 120 and the gate insulating layer 117 are formed using the same mask, and the present disclosure is not limited thereto. The gate insulating layer 117 can be further formed on the buffer layer 110 including the semiconductor layer 105 except for the source electrode 136 and the drain electrode 137.

An interlayer insulating layer 140 is further provided between the gate electrode 120 and the source/drain electrodes 136/137, and a passivation layer 145 for protecting the thin film transistor TFT is further provided thereon.

The buffer layer 110, the interlayer insulating layer 140, and the passivation layer 145 are made of an insulating material. For example, the buffer layer 110, the interlayer insulating layer 140, and the passivation layer 145 can be formed of an inorganic insulating material such as silicon oxide, silicon nitride, or silicon oxynitride, but the present disclosure is not limited thereto. If necessary, an organic insulating material can be further used.

In addition, a planarization layer 147 for planarization is further provided on the passivation layer 145, and the planarization layer 147 and the passivation layer 145 are selectively removed to form a contact hole through which the drain electrode 137 is selectively exposed. An anode material can be deposited on the planarization layer 147 including the contact hole and selectively removed to connect the drain electrode 137 and the anode 151 through the contact hole.

As shown in FIGS. 3 and 4, the anode 151 includes the anode emission part 151*a* corresponding to the emission part EM, the anode driving part 151*c* corresponding to the sub-pixel driver, and the anode connection part 151*b* for connecting the anode emission part 151*a* and the anode driving part 151*c*, and can additionally include the anode extension part 151*e* positioned around the anode emission part 151*a*.

The light emitting display device of the present disclosure is not limited to a top emission type and a bottom emission type. In the case of the bottom emission type, the material of the anode 151 can be a transparent electrode component such as ITO, IZO, or ITZO, and the cathode 153 can be a metal including aluminum, silver (Au), magnesium (Mg), or gold (Au), or a reflective metal alloy. When the light emitting display device is a top emission type, the material of the anode 151 can include a reflective metal, and the cathode 153 can be a transparent electrode or can be formed of a reflective transmissive metal.

The light emitting element OLED transmits light by resonance due to microcavity between the anode 151 and the cathode 153 and has a thickness of 1 μm or less, and the thickness of the electrodes included therein is 1000 Å or less, and in the case of a reflective transmissive light emitting display device in particular, the light emitting element OLED has a thickness of 200 Å or less, and thus light can pass through the electrodes even if the electrodes include a reflective metal.

Figure 7A:
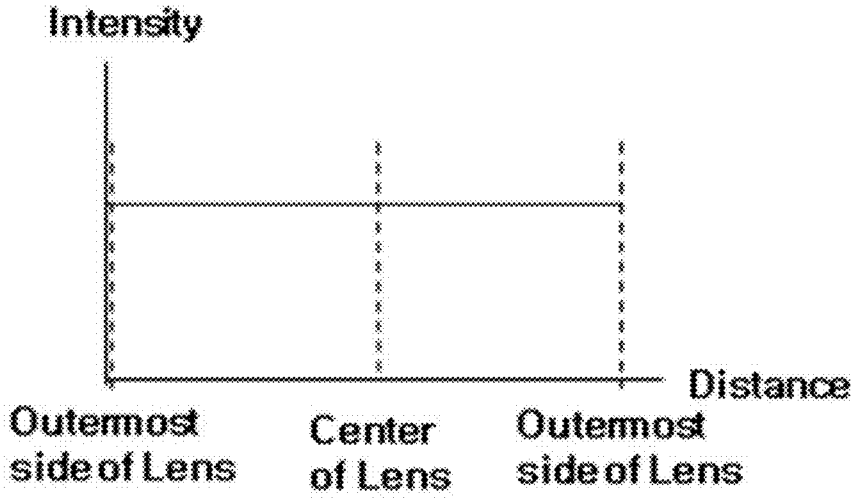
FIGS. 7A and 7B are graphs showing the intensity of light for each area in the repair lens and an anode connection pattern when laser light for repair is applied.
Figure 7B:
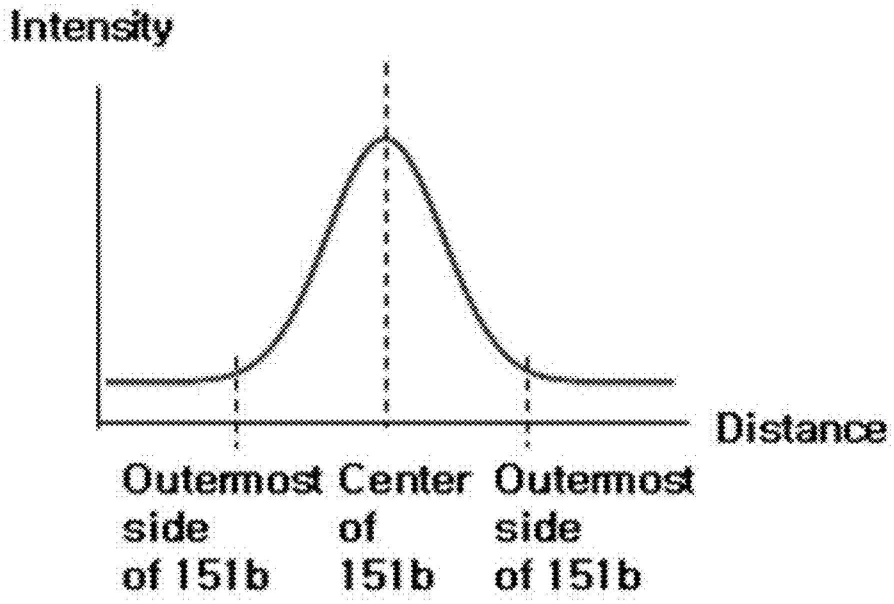

FIG. 7A and FIG. 7B are graphs showing the intensity of light for each area in the repair lens and an anode connection part when laser light for repair is applied.

The anode 151 can include a reflective metal when the light emitting display device of the present disclosure is of the top emission type and can be a transparent electrode when the light emitting display device of the present disclosure is of the bottom emission type. In any case, laser light transmitted with the same intensity through a laser light transmission path from the substrate 100 to the repair lens LRP, as shown in FIG. 7A, is focused at the center of the repair lens LRP while passing through the repair lens LRP as shown in FIG. 7B. Accordingly, the light is transmitted to and concentrated on the center of the anode connection part 151*b*, and thus the light can be focused on the anode connection part 151*b* without being transmitted to the cathode 153 outside the anode connection part 151*b*. Therefore, since light is concentrated on and transmitted to the anode connection part 151*b*, the cathode 153 can be prevented from being damaged.

In addition, when laser light for repair is radiated, the light from the bottom of the substrate 100 is concentrated on the anode connection part 151*b* at least inside the innermost closed loop pattern 116 because no metal is provided between the repair lens LRP and the anode connection unit 151*b*, and thus the anode emission part 151*a* can be separated from the anode driving part 151*c* by destroying the anode connection part 151*b* using the laser light.

The separated anode emission part 151*a* can be connected to the driving circuit of a neighboring sub-pixel to enable normal operation.

Figure 8:
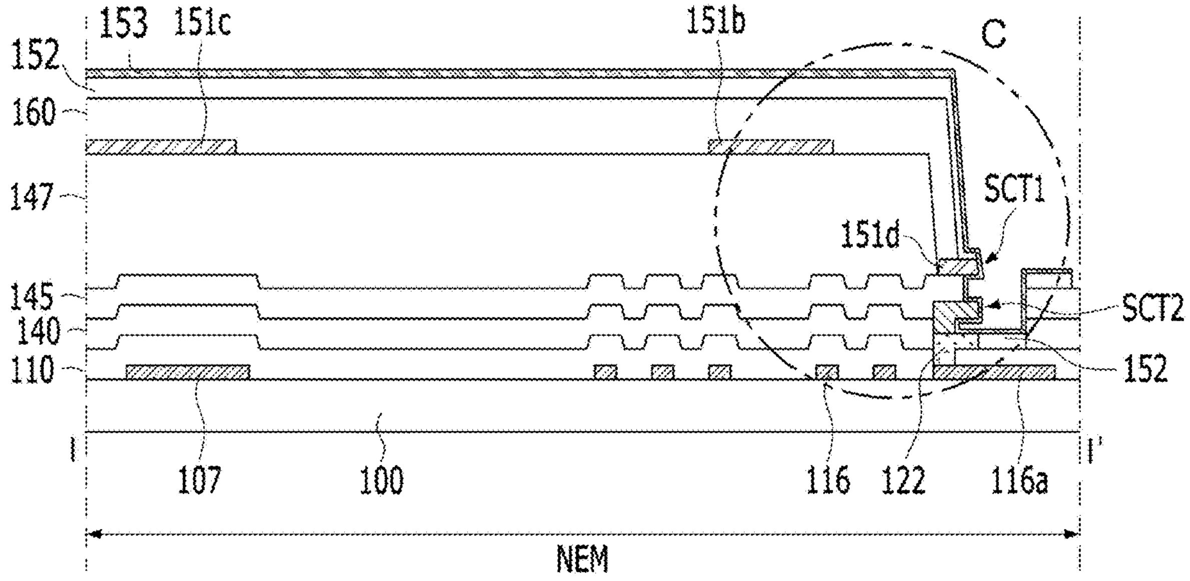
FIG. 8 is a cross-sectional view taken along line I-I' of FIG. 4.
Figure 9:
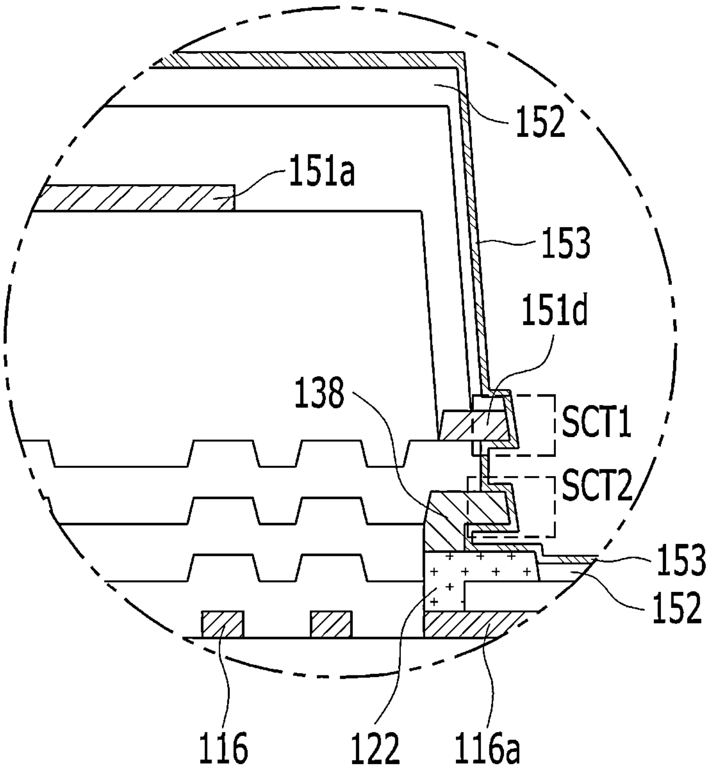
FIG. 9 is a cross-sectional view showing connection between a cathode and an extension part of the repair lens of FIG. 8.

FIG. 8 is a cross-sectional view taken along line I-I' of FIG. 4. FIG. 9 is a cross-sectional view showing connection between the cathode and an extension part of the repair lens of FIG. 8.

FIGS. 8 and 9 show an embodiment in which the cathode 153 is connected to the extension part (LRP_c) 116*a* of the repair lens such that the base voltage can be supplied from the first power supply voltage line VSL.

As shown in FIGS. 8 and 9, the first power supply voltage line VSL and the extension part 116*a* extending from the outermost closed loop pattern of the repair lens are connected to each other through a first auxiliary pattern 122 and a second auxiliary pattern 138 provided on the extension part 116*a*.

The first auxiliary pattern 122 can be located on the same layer as the gate electrode 120, and the second auxiliary pattern 138 can be located on the same layer as the source electrode 136 and the drain electrode 137.

The passivation layer 145 is formed on the second auxiliary pattern 138, and an anode dummy pattern 151*d* is formed on the passivation layer 145 at the same level as the anode 151 separately from the anode 151 in a region where the second auxiliary pattern 138 is formed.

After forming the anode dummy pattern 151*d*, the passivation layer 145 and the interlayer insulating film 140 can be selectively etched such that the anode dummy pattern 151*d* and the second auxiliary pattern 138 are protruded from the passivation layer 145 and the interlayer insulating layer 140 disposed thereunder to form a first protrusion SCT1 and a second protrusion SCT2. In this case, the structure in which the passivation layer 145 and the interlayer insulating layer 150 are further etched than the layers disposed thereon is referred to as an undercut structure.

After the bank 160 is formed, a deposition process for forming an organic layer is performed on the entire display area AA. During the deposition process, an organic material does not accumulate on the region of the vertical anode dummy pattern 151*d* having the first and second protrusions SCT1 and SCT2 or the passivation layer 145 and the interlayer insulating layer 140 having the undercut side under the region of the anode dummy pattern 151*d* even if a separate fine metal mask is not used.

For example, when the organic material is vaporized and deposited, the straightness of the organic material is excellent, and thus the deposition characteristic is excellent on a flat surface but the step coverage characteristic is not good in an area having a vertical or obstructive structure. Accordingly, the continuity of the organic layer 152 is not maintained at the first and second protrusions SCT1 and SCT2 and the undercut sides of the passivation layer 145 and the interlayer insulating layer 140.

In an example of the light emitting display device of the present disclosure, deposition of the organic material may be prevented on the first auxiliary pattern 122 directly connected to the extension pattern 116*a* of the repair lens LRP, by providing the undercut structure and the protruding structure of the anode dummy pattern 151*d* and the second auxiliary pattern 138.

In addition, the cathode 153 formed after the formation of the organic layer 152 has relatively good step coverage characteristics, and thus deposition can be performed even on a protruding or undercut region. For example, the cathode 153 can be formed on a lateral surface and a lower surface of the vertical anode dummy pattern 151*d* having the first and second protrusions SCT1 and SCT2 or on the passivation layer 145 and the interlayer insulating layer 140 having undercut sides disposed under the anode dummy pattern 151*d* and connected to the first auxiliary pattern 122. Accordingly, the base voltage signal can be applied to the cathode 153 through the extension pattern 116*a* connected to the first auxiliary pattern 122 and the first power supply voltage line (refer to VSL in FIGS. 3 and 4). When such an undercut structure is provided for each sub-pixel or a plurality of sub-pixels of the substrate 100, the base voltage is supplied to the cathode 153 in the display area AA, and thus a signal can be uniformly applied to the cathode 153 throughout the display area AA and luminance decrease for each area can be prevented.

In addition, since only transparent insulating layers 110, 140, 145, and 147 are provided between the anode connection part 151*b* and the substrate 100 corresponding to the innermost closed loop pattern of the repair lens LRP, as shown in FIG. 8, laser light passes through the center of the repair lens even if the repair lens LRP is made of a light-shielding metal.

Figure 10:
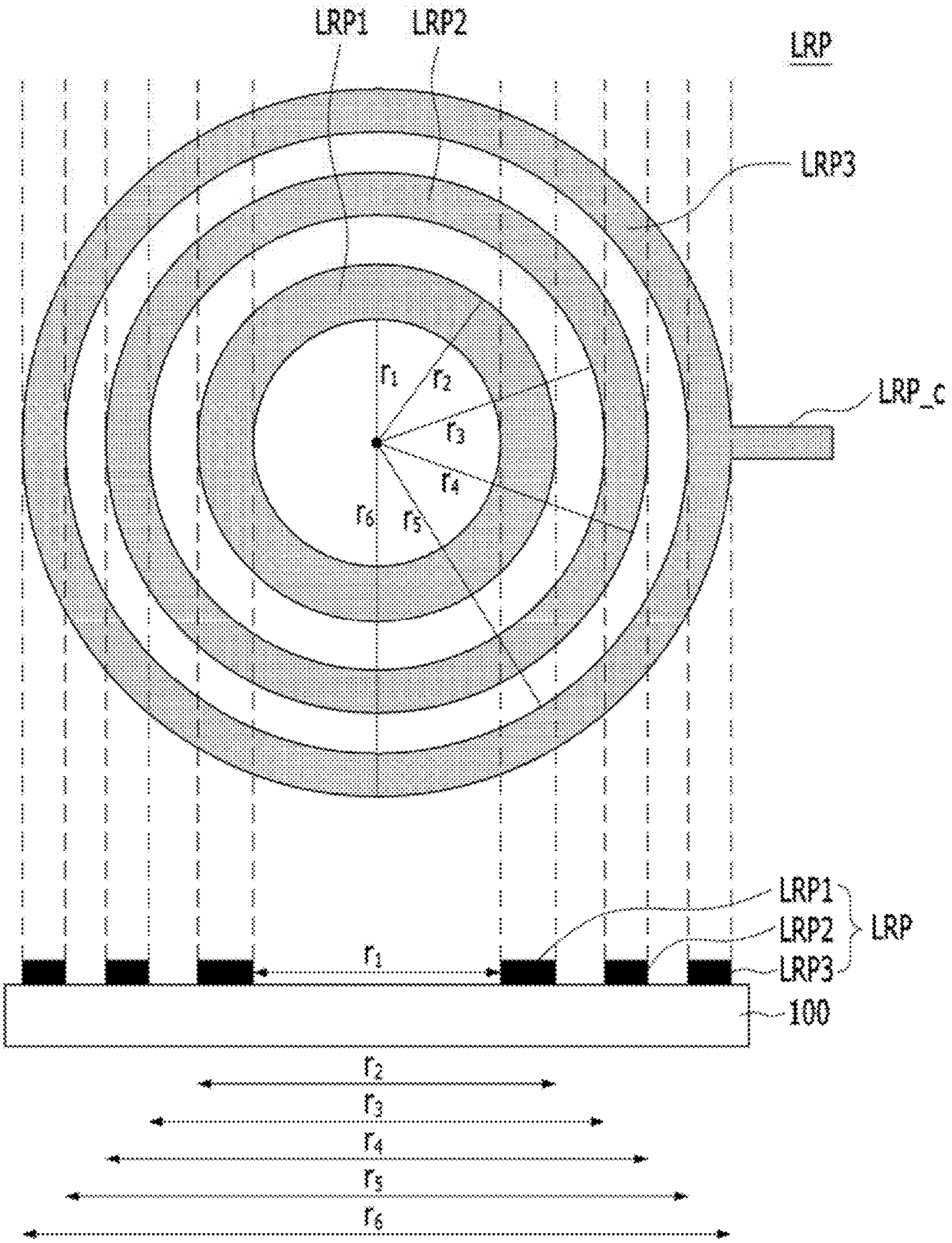
FIG. 10 is a plan view and a cross-sectional view of the repair lens of FIGS. 3 and 4.

FIG. 10 is a plan view and a cross-sectional view of the repair lens of FIGS. 3 and 4.

As shown in FIG. 10, when the repair lens is composed of three closed loop patterns, the first closed loop pattern LRP1 has first and second circles corresponding to the inner and outer diameters thereof.

The second closed loop pattern LRP2 has third and fourth circles corresponding to the inner and outer diameters thereof.

The third closed loop pattern LRP3 has fifth and sixth circles corresponding to the inner and outer diameters thereof.

The radius of each circle of the closed loop patterns of the repair lens satisfies the following equation:

$$r_n = \sqrt{n\lambda f + \frac{n^2\lambda^2}{4}}$$

where n is the order of circles from the center, λ is the wavelength of laser light, and f is the vertical distance from the center of the repair lens to the anode connection part.

Here, λ is a laser wavelength of 1064 nm, and in order to focus light from the substrate 100 onto the anode connection part 151*b*, a focal distance f is determined by the sum of the thicknesses of transparent insulating layers, for example, the buffer layer 110, the interlayer insulating layer 140, the passivation layer 145, and the planarization layer 147. In experiments, the sum of the thicknesses was set to 3.5 μm.

In this case, the radiuses of the circles determined by the inner and outer diameters of the closed loop patterns LRP1, LRP2, and LRP3 are determined as shown in Table 1 in the following order.

TABLE 1

| Order of circles from center | Radius $r_n$ [μm] |
|---|---|
| n = 1 | 2.00 |
| n = 2 | 2.93 |
| n = 3 | 3.70 |
| n = 4 | 4.41 |
| n = 5 | 5.07 |
| n = 6 | 5.70 |

For example, a radius difference between the inner diameter and the outer diameter of the first closed loop pattern LRP1 is 0.93 μm, and the width of the first closed loop pattern LRP1 is as thin as 1.86 μm. In addition, a radius difference between the inner diameter and the outer diameter of the second closed loop pattern LRP2 is 0.71 μm, and the width of the second closed loop pattern LRP1 is 1.42 μm, which is narrower than the first closed loop pattern LRP1. A radius difference between the inner and outer diameters of the third closed loop pattern LRP3 is 0.63 μm, and the width of the third closed loop pattern LRP1 is 1.26 μm, which is narrower than the second closed loop pattern LRP2. It can be ascertained that the widths of outer patterns are narrowed. In this manner, the repair lens LRP having a diffraction function can be realized through patterning in order to focus light on the anode connection part 151*b* in the vertical direction without hindering transmission of light by the closed loop patterns.

The radius of the outer circle of the outermost third closed loop pattern LRP3 is 5.7 μm, and thus the diameter of the outer circle is 11.4 μm. Accordingly, when the width of the anode connection part 151*b* of the present disclosure is 1 μm or more and 10 μm or less, light can be concentrated on the anode connection part 151*b* according to the outermost closed loop pattern LRP3 disposed outside the anode connection part 151*b*.

Figure 11:
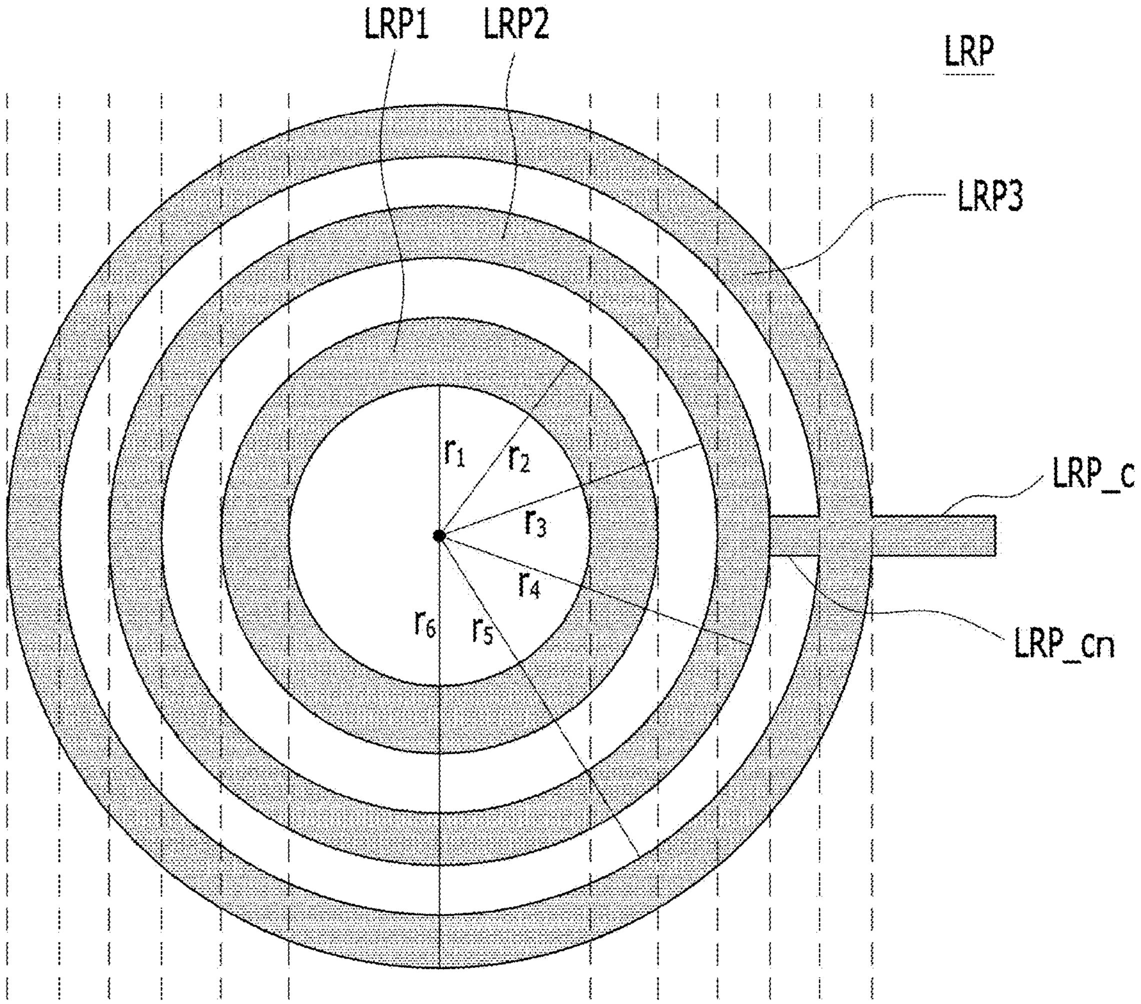
FIG. 11 is a plan view of a repair lens according to another embodiment of the present disclosure.

FIG. 11 is a plan view of a repair lens according to another embodiment of the present disclosure.

As shown in FIG. 11, the repair lens according to another embodiment of the present disclosure further includes an additional connection part LRP_cn between the closed loop patterns LRP2 and LRP3 in addition to the extension pattern LRP_c protruding to the outside of the outermost closed loop pattern LRP3. Accordingly, the closed loop patterns LRP2 and LRP3 have a uniform voltage characteristic, and thus the base voltage signal can be supplied to the cathode 153 more stably.

Figure 12:
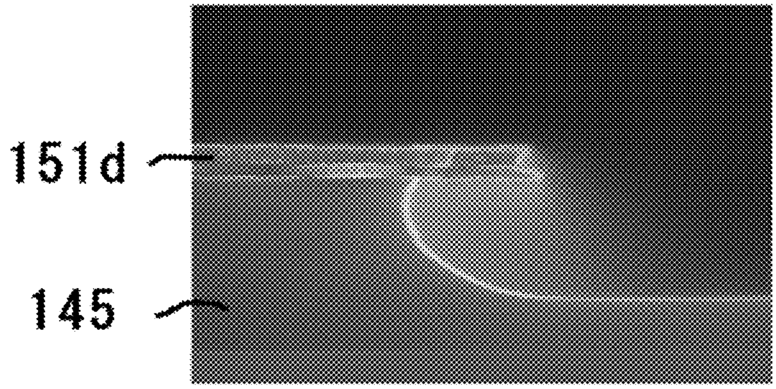
FIG. 12 is an optical photograph showing an example of an undercut structure of FIG. 9.

FIG. 12 is an optical photograph showing an example of the undercut structure of FIG. 9.

FIG. 12 shows an example in which the passivation layer 145 has an undercut structure with respect to the anode dummy pattern 151*d* according to the example described in FIGS. 8 and 9 through an experiment.

In the undercut structure of the example shown in FIGS. 8 and 9, any one of the first and second auxiliary patterns 122 and 138 can be omitted. In some cases, a structure in which the cathode 153 is directly connected to the second auxiliary pattern 138 or the first auxiliary pattern 122 without the anode dummy pattern 151*d* is also possible. Further, a structure in which the upper portion of the first power supply voltage line VSL is directly exposed, the organic layer 152 is disconnected on the undercut insulating layers 110, 140, and 145 thereon, and the cathode 153 directly comes into contact with the undercut insulating layers 110, 140, and 145 and is connected to the upper portion of the first power voltage line VSL under the undercut insulating layers 110, 140, and 145 is also possible.

In an inspection process, a sub-pixel having a defect of a bright or dark spot can be repaired by applying energy to an anode including a metal among components constituting the light emitting element of the sub-pixel device through laser radiation to separate the anode.

In a repair process, a laser is radiated to a predetermined portion of the anode. Here, since the anode and the cathode overlap in the light emitting element, the light emitted from the laser passes through the anode and can damage the cathode disposed thereon. The laser light can directly affect the cathode through the side of the anode to which the laser light is radiated, thus damaging the cathode. Laser radiation during repair can burn a metal because strong energy is locally applied. Accordingly, laser light passing through the anode can affect the cathode to generate crack in the cathode or damage the cathode. In addition, moisture can penetrate through the crack or a damaged portion into the organic layer under the cathode and affect the organic layer. This can reduce the lifespan of the light emitting display device.

The anode of a sub-pixel detected as a defective sub-pixel is separated by radiating a laser thereto. In the repair process, laser light is radiated to the anode to apply energy enough to burn the anode to separate the anode. The light emitting display device according to an embodiment of the present disclosure can include the repair lens provided under the thin anode on which the repair process is performed such that light that has passed through the repair lens can be focused on the anode to be repaired.

Further, in the light emitting display device of the present disclosure, the repair lens can have a focal point in the anode and can control the ambient light passing through the portion around the anode to prevent the cathode from being damaged by the ambient light during radiation of a laser.

In addition, the repair lens can extend from one side to be connected to the power supply voltage line such that a power supply voltage signal can be applied thereto to stabilize the voltage in the cathode. The extended part of the repair lens is connected to the outermost closed loop pattern and thus does not affect light passing through the repair lens.

In addition, the cathode and the power supply voltage line are connected through an undercut portion between the metal layer and metals, and thus after formation of the anode, the anode dummy pattern, which is a same layer as the anode, can be connected to the cathode and the power supply voltage line under the undercut portion through the undercut portion which are provided in the insulating layers, under the anode dummy pattern without a separate fine metal mask. Accordingly, the cathode is connected to the power supply voltage line located thereunder and thus the power supply voltage is supplied to sub-pixels in the display area as well as the non-display area. Accordingly, the electric fields of the cathode can be uniformly maintained even in the large-area light emitting display device. Therefore, it is possible to maintain a uniform luminance by preventing a decrease in luminance in a specific area.

To this end, the light emitting display device of the present disclosure can include a substrate including a plurality of sub-pixels each including an emission part and a non-emission part, a light emitting element including an anode, an organic layer, and a cathode at each of the sub-pixels and, and a repair lens under the anode. The repair lens can be formed of a light-shielding metal layer, without having other metal layers between the anode and the repair lens in a vertical direction.

The anode can include an anode emission part corresponding to the emission part, an anode driving part corresponding to a driving circuit, and an anode connection part connecting the anode emission part and the anode driving part, and the anode connection part can be narrower than the anode emission part and the anode driving part.

The anode connection part and the anode driving part other than the anode emission part can be covered by a bank.

The repair lens can correspond to the anode connection part, and the outermost portion of the repair lens can be outside the anode connection part.

The repair lens can include a plurality of closed loop patterns spaced apart from each other having radiuses gradually increasing from the center to the outside.

Only a transparent insulating layer can be provided between the substrate and the anode connection part corresponding to an innermost closed loop pattern of the repair lens.

The radiuses of the closed loop patterns of the repair lens satisfy the following equation:

$$r_n = \sqrt{n\lambda f + \frac{n^2\lambda^2}{4}}$$

where n is the order of the radiuses from the center, λ is the wavelength of laser light, and f is a vertical distance from the center of the repair lens to the center of the anode connection part.

An outermost closed loop pattern of the repair lens can be connected to a power supply voltage line through an extension pattern, and a base voltage can be supplied to the cathode through the power supply voltage line.

The repair lens can further include at least one connection parts between the closed loop patterns.

The power supply voltage line and the extension pattern can be the same layer as the repair lens.

The light emitting display device according to an embodiment of the present disclosure can further include an anode dummy pattern partially overlapping with the extension pattern or the power supply voltage line and spaced apart from the anode. The anode dummy pattern can be electrically connected to the cathode and the power supply voltage line or the extension pattern.

The anode dummy pattern can be formed of a same layer as the anode.

The light emitting display device can further include one or more auxiliary electrodes directly connected to the extension pattern or the power supply voltage line.

The light emitting display device can further include an insulating layer having an undercut structure between the auxiliary electrodes and the anode dummy pattern. The cathode can be connected to the auxiliary electrodes through a side and lower surface of the anode dummy pattern and a sidewall of the undercut structure.

The anode can be connected to a thin film transistor, and the repair lens can be positioned under a buffer layer. The buffer layer can be interposed between the thin film transistor and the repair lens.

The light emitting display device can further include a plurality of insulating layers between the buffer layer and the anode, wherein the sum of thicknesses of the buffer layer and the plurality of insulating layers can correspond to a focal distance in which the repair lens focuses light on the anode.

The anode connection part can have a width ranging from 1 μm to 10 μm.

The present disclosure relates to a light emitting display device including a lens for focusing laser light to the anode connection pattern which is integrated with the anode of the emission part. In a repair process, a laser is radiated to the anode connection pattern in order to separate the anode connection pattern from the anode of the emission part. Thus energy is concentrated on a local region of the anode connection pattern during repair to prevent metal layers other than the anode connection pattern from being damaged and to achieve a normal repair.

The light emitting display device of the present disclosure has the following effects.

The light emitting display device of the present disclosure includes the repair lens provided under a thin anode where a repair process is performed such that light passing through the repair lens can be focused on the anode to be repaired.

While the embodiments of the present disclosure have been described with reference to the accompanying drawings, the present disclosure is not limited to the embodiments and can be embodied in various different forms, and those skilled in the art will appreciate that the present disclosure can be embodied in specific forms other than those set forth herein without departing from the technical idea and essential characteristics of the present disclosure. The disclosed embodiments are therefore to be construed in all aspects as illustrative and not restrictive.

What is claimed is:

1. A light emitting display device comprising:

a substrate including a plurality of sub-pixels, each of the plurality of sub-pixels including an emission part and a non-emission part;

a thin film transistor on the substrate at each of the plurality of sub-pixels;

a light emitting element over the thin film transistor, the light emitting element including an anode, an organic layer, and a cathode at each of the plurality of sub-pixels; and a repair lens between the substrate and the anode, wherein the repair lens is disposed at a same layer as a light-shielding metal layer under the thin film transistor, and wherein the repair lens includes a plurality of closed loop patterns spaced apart from each other having radiuses gradually increasing from a center to an outside.

2. The light emitting display device of claim 1, wherein the radiuses of the closed loop patterns of the repair lens satisfy the following equation:

$$r_n = \sqrt{n\lambda f + \frac{n^2\lambda^2}{4}}$$

where n is the order of the radiuses from the center, A is a wavelength of laser light, and f is a vertical distance from a center of the repair lens to a center of the anode connection part.

3. The light emitting display device of claim 1, wherein the repair lens further includes at least one connection parts between the closed loop patterns.

4. The light emitting display device of claim 1, wherein the anode is electrically connected to the thin film transistor, the repair lens is positioned under a buffer layer, and the buffer layer is interposed between the thin film transistor and the repair lens.

5. The light emitting display device of claim 4, further comprising a plurality of insulating layers between the buffer layer and the anode, wherein a sum of thicknesses of the buffer layer and the plurality of insulating layers corresponds to a focal distance in which the repair lens focuses light on the anode.

6. The light emitting display device of claim 1, wherein the repair lens is in contact with a surface of the substrate.

7. The light emitting display device of claim 1, wherein the anode includes:

an anode emission part corresponding to the emission part, an anode driving part corresponding to a driving circuit, and an anode connection part connecting the anode emission part and the anode driving part, and wherein the anode connection part is narrower than each of the anode emission part and the anode driving part.

8. The light emitting display device of claim 7, further comprising a bank covering the anode connection part and the anode driving part.

9. The light emitting display device of claim 7, wherein the repair lens is overlapped with the anode connection part, and the outermost portion of the repair lens is outside the anode connection part.

10. The light emitting display device of claim 9, wherein only a transparent insulating layer is provided between the substrate and the anode connection part corresponding to an innermost closed loop pattern of the repair lens.

11. The light emitting display device of claim 7, wherein the anode connection part has a width ranging from about 1 μm to about 10 μm.

12. The light emitting display device of claim 1, wherein an outermost closed loop pattern of the repair lens is connected to a power supply voltage line through an extension pattern, and a base voltage is supplied to the cathode through the power supply voltage line.

13. The light emitting display device of claim 12, wherein the power supply voltage line and the extension pattern are positioned at a same layer as the repair lens.

14. The light emitting display device of claim 12, further comprising an anode dummy pattern partially overlapping with the extension pattern or the power supply voltage line and spaced apart from the anode, wherein the anode dummy pattern is electrically connected to the cathode and the power supply voltage line or the extension pattern.

15. The light emitting display device of claim 14, wherein the anode dummy pattern is formed of a same layer as the anode.

16. The light emitting display device of claim 12, further comprising one or more auxiliary electrodes directly connected to the extension pattern or the power supply voltage line.

17. The light emitting display device of claim 16, further comprising an insulating layer having an undercut structure between the auxiliary electrodes and an anode dummy pattern, wherein the cathode is connected to the auxiliary electrode through a side and lower surface of the anode dummy pattern and a sidewall of the undercut structure.

18. A light emitting display device comprising:

a substrate including a plurality of sub-pixels, each of the plurality of sub-pixels including an emission part and a non-emission part;

a light emitting element including an anode, an organic layer, and a cathode at each of the plurality of sub-pixels; and a repair lens between the substrate and the anode, wherein the repair lens includes a plurality of closed loop patterns spaced apart from each other having radiuses gradually increasing from a center to an outside.

19. The light emitting display device of claim 18, wherein the repair lens comprises a light shielding metal layer at a same layer as a shield metal under a thin film transistor and the shield metal under the thin film transistor prevents impurities under the substrate from having an electrical influence on a semiconductor layer of the thin film transistor.

* * * * *